United States Patent [19]

Nuechterlein

[11] Patent Number: 5,663,672
[45] Date of Patent: Sep. 2, 1997

[54] TRANSISTOR GATE DRIVE CIRCUIT PROVIDING DIELECTRIC ISOLATION AND PROTECTION

[75] Inventor: Paul E. Nuechterlein, Rockford, Ill.

[73] Assignee: Sundstrand Corporation, Rockford, Ill.

[21] Appl. No.: 560,418

[22] Filed: Nov. 17, 1995

[51] Int. Cl.$^6$ .................................................. H03K 17/04
[52] U.S. Cl. .......................... 327/374; 327/108; 327/377; 327/432
[58] Field of Search ........................ 327/108–112, 404, 327/432, 434, 427, 392, 384; 323/288, 289; 363/131–133

[56] References Cited

U.S. PATENT DOCUMENTS

| | | |
|---|---|---|
| 3,581,110 | 5/1971 | Belcastro ........................ 327/310 |
| 4,017,743 | 4/1977 | Hartman ......................... 327/310 |
| 4,339,671 | 7/1982 | Park et al. ...................... 327/377 |
| 4,551,635 | 11/1985 | Kuroki .......................... 327/108 |
| 4,605,865 | 8/1986 | Yuzurihara ...................... 327/434 |
| 4,694,206 | 9/1987 | Weinberg ........................ 327/404 |
| 4,709,161 | 11/1987 | Mizohata et al. ................. 327/109 |
| 4,748,351 | 5/1988 | Barzegar ........................ 327/384 |
| 5,019,719 | 5/1991 | King ............................ 327/110 |
| 5,214,315 | 5/1993 | Dunnam ......................... 327/109 |
| 5,530,385 | 6/1996 | Miettinen ....................... 327/108 |

Primary Examiner—Timothy P. Callahan
Assistant Examiner—Kenneth B. Wells
Attorney, Agent, or Firm—Lawrence E. Crowe

[57] ABSTRACT

A gate drive circuit for a power transistor provides improved dielectric isolation and protection against inadvertent turn ON of the power transistor. The gate drive circuit includes a first circuit means for providing a bias power signal and a trigger pulse signal to a second circuit means in response to a control signal from an external control circuit connected to said first circuit means. The bias power signal and the trigger pulse signal are coupled from the first circuit means to the second circuit means by magnetic induction through a first and a second coupling transformer, respectively, with the first and second coupling transformers thereby providing separate pathways for coupling of the bias power signal and the trigger pulse signal between the first and second circuit means. The first and second coupling transformers further provide dielectric isolation between the first and second circuit means along each of the separate pathways.

16 Claims, 3 Drawing Sheets

TRANSISTOR GATE DRIVE CIRCUIT PROVIDING DIELECTRIC ISOLATION AND PROTECTION

FIELD OF THE INVENTION

This invention relates to a gate drive circuit for a power transistor providing improved dielectric isolation and protection against inadvertent turn ON of the power transistor.

BACKGROUND OF THE INVENTION

In order to find true utility in a modern, high-speed switching application, a gate drive circuit for a power transistor must meet several basic criteria.

The gate drive must ensure that the power transistor will not be inadvertently turned ON at any time during steady-state operation, initial power-up, or during shutdown of the gate drive. The gate drive must prevent inadvertent turn ON as a result of factors such as: electromagnetic interference present in the operating environment of the power transistor; spurious electrical noise inherent in the operation of associated circuitry; or inherent parasitic capacitances present within the power transistor. Particularly in high power applications, inadvertent turn ON of the power transistor may result in severe damage or destruction of the power transistor and the circuit in which the power transistor is utilized.

The gate drive must also be capable of achieving very rapid switching rates, on the order of a few hundred nanoseconds for some applications, in order to allow the precise timing of switching the power transistor necessary for minimizing harmonic distortion at electrical loads connected to the power transistor.

The gate drive must further provide a convenient electrical interface between the power transistor and associated control logic circuitry. Control of the gate drive is typically provided by control circuitry external to the gate drive. Such external control circuitry typically utilizes microprocessor based logic circuitry which functions with low voltage potential electrical signals. The gate drive must provide conversion of low voltage potential control signals received from the external control circuitry to high voltage potential signals required for switching the power transistor.

In attempting to satisfy the basic criteria defined above, it is well known in the art to utilize transformers for coupling the gate drive between associated control logic circuitry and the power transistor. Transformer coupling provides dielectric isolation of the gate drive-from spurious noise in control circuitry and allows control signal voltages to be stepped up or down to facilitate electrical interfacing with associated circuitry. It is also well known in the art that by providing a reverse-bias voltage across the gate-emitter junction of the power transistor during the OFF state, the resistance of the power transistor to inadvertent turn ON is greatly enhanced. It is further well known in the art that switching speed of the power transistor may be increased by incorporating energy storage devices such as capacitors into the gate drive which inject an electrical charge into the power transistor at the instant of switching in order to quickly extinguish charge carriers accumulated within the transistor.

An example of a prior gate drive circuit incorporating transformer coupling is provided by FIGS. 21-27 and associated text on pages 564 and 565 of a standard textbook entitled *POWER ELECTRONICS: CONVERTERS, APPLICATIONS, DESIGN* by Mohan, Undeland, and Robbins, (Wiley, New York 1989). Mohan describes a transformer-isolated gate drive having a single coupling transformer utilized to couple both control signals and bias power signals from an external control circuit to the gate drive. The circuit of Mohan et al does not, however, incorporate provisions for providing a reverse-bias voltage to ensure holding the power transistor in the OFF state. The circuit of Mohan et al also introduces significant delay at turn OFF since resistor R2 and capacitor C2, as shown in FIGS. 21-27, must discharge before turn OFF can occur.

U.S. Pat. No. 4,605,865 to Yuzurihara describes an input drive apparatus for a power transistor utilizing a two phase oscillator in conjunction with multiple transformers having air gaps to provide electrical insulation between an input side circuit means and an output side circuit means. Electromagnetic energy stored in the transformers is utilized as a source of bias voltage for the power transistor. The input drive apparatus of Yuzurihara does not provide energy storage devices downstream of the transformers for increasing switching speed of the power transistor, and further does not incorporate provisions for providing a sustained reverse-bias voltage across the power transistor during the OFF state to preclude inadvertent turn ON of the power transistor.

U.S. Pat. No. 4,694,206 to Weinberg describes a drive circuit for a power field effect transistor utilizing two switching circuits connected between the gate and source electrodes of a field effect transistor, with each of the switching circuits comprising a controlled switch and a secondary winding of a pulse transformer to provide electrical isolation between the control electronics and the power switching circuit of the field effect transistor: The drive circuit of Weinberg further provides short switching delay times and provides a negative gate-source voltage during the OFF period by periodically recharging the gate-source capacitance inherent within the field effect transistor. The drive circuit of Weinberg does not, however, provide energy storage downstream of the pulse transformers for increasing switching speed of the power transistor by injecting electrical charge to rapidly extinguish accumulated carrier charges, and further, does not incorporate means for providing a sustained reverse-bias voltage across the field effect transistor during the OFF state to preclude inadvertent turn ON of the field effect transistor.

U.S. Pat. No. 4,748,351 to Barzegar describes a power MOSFET gate driver circuit providing reduced noise susceptibility which utilizes dual drive paths to provide turn-ON and turn-OFF bias signals to the gate of the MOSFET via a pulse transformer having two serially connected secondary windings. Turn-ON pulses are coupled by a diode from the first secondary to the MOSFET gate. Turn-OFF pulses are coupled via the second secondary to a control MOSFET which is turned ON by a turn-OFF pulse and remains. ON to keep the gate of the MOSFET switch at a hold-OFF voltage for a period of time after the MOSFET is turned ON. The diode of Barzegar, however, only keeps the gate of the MOSFET high, and thus at hold-OFF voltage, until the transformer 110 of Barzegar saturates. Once the transformer reaches saturation, the hold-OFF voltage is lost. This sort of saturation and loss of the hold-OFF voltage is a serious problem in the design of practical inverters. Without a sustained hold-OFF voltage, the inverter can be inadvertently turned on as described above.

Barzegar cannot be said, therefore, to provide sustained reverse-bias voltage across the field effect transistor during the OFF-state to preclude inadvertent turn ON of the field effect transistor. Furthermore, Barzegar does not provide means for energy storage downstream of the pulse transformer for increasing switching speed of the MOSFET by injecting electrical charge to rapidly extinguish accumulated carrier charges.

U.S. Pat. No. 5,019,719 to King describes a transformer coupled gate drive circuit for power MOSFETs which produces a sharply rising gate drive signal to improve switching speed, and which provides electrical isolation through transformer coupling. The gate drive of King includes a pair of low power switching devices and a storage capacitor coupled through a transformer to a CMOS switching circuit. The storage capacitor of King is utilized to increase switching speed of the MOSFET. King does not, however, include means for providing a sustained reverse-bias voltage across the MOSFET during the OFF state to preclude inadvertent turn ON of the MOS FET.

Although each of the gate drives referenced above incorporates means for achieving one or more of the basic criteria for utility, none of them, when considered individually or in combination, represents a gate drive which meets all of the basic criteria for utility defined herein. The invention to be described hereinafter, advances the state of the art in gate drives for power transistors by providing means for satisfying all of the basic criteria for utility defined herein.

SUMMARY OF THE INVENTION

This invention relates to a gate drive circuit for a power transistor providing improved dielectric isolation and protection against inadvertent turn ON of the power transistor. The gate drive circuit includes a first circuit means for providing a bias power signal and a trigger pulse signal to a second circuit means in response to a control signal from an external control circuit connected to the first circuit means. The bias power signal and the trigger pulse signal are coupled from the first circuit means to the second circuit means by magnetic induction through a first and a second coupling transformer, respectively, with the first and second coupling transformers thereby providing separate pathways for coupling of the bias power signal and the trigger pulse signal between the first and second circuit means. The first and second coupling transformers further provide dielectric isolation between the first and second circuit means along each of the separate pathways.

The second circuit means is connected across a gate electrode and an emitter electrode of the power transistor. The second circuit means includes circuitry and energy storage devices which allow the gate drive of the invention to cause the power transistor to switch at very high speed and to provide a reverse-bias voltage signal impressed, across a gate-emitter junction within the power transistor when the control signal is supplied to the first circuit means by the external control circuit, thereby causing the power transistor to turn OFF and to remain in an OFF state. The circuitry and energy storage devices within the second circuit means also allow the gate drive of the invention to provide a forward bias voltage impressed across the gate-emitter junction of the power transistor when the control signal is not present, thereby causing the power transistor to turn ON and to remain in an ON state.

Utilization of separate coupling transformers for transmission of the bias power signal and the control signal between the first and second circuit means provides a degree of dielectric isolation and noise immunity superior to prior transformer coupled gate drives.

In a preferred embodiment of the invention, the first circuit means includes an oscillator circuit, an apply/inhibit circuit, a control signal conditioning circuit, and a drive circuit. The various circuits of the first circuit means cooperate to produce the bias power signal and the trigger pulse signal for coupling to the second circuit means by the first and second coupling transformers.

Specifically, the oscillator circuit generates an alternating current bias power signal. The apply/inhibit circuit controls application of the bias power signal to the first coupling transformer in response to the control signal. When the control signal is present, the apply/inhibit circuit causes the bias power signal to be applied to the first coupling transformer. When the control signal is not present, the apply/inhibit circuit causes the bias power signal to be removed from the first coupling transformer.

The drive circuit within the first circuit means of the preferred embodiment converts the control signal from a low voltage, low current control signal compatible with control logic circuitry external to the gate drive into a high voltage, high current signal to facilitate transformer coupling of the control signal between the first and second circuit means. The control signal conditioning circuit within the first circuit means of the preferred embodiment converts the control signal to a trigger pulse signal which is coupled through the second coupling transformer to the second circuit means.

The second circuit means of the preferred embodiment includes a bias voltage power supply circuit having a rectifier circuit and a voltage divider circuit, a latching switch circuit, a steady-state protection circuit, and a transient protection circuit. The various circuits of the second circuit means cooperate to convert the bias power signal received from the first circuit means to bias voltages applied across the power transistor in response to the control signal supplied to the gate drive by the external control circuit. Specifically, the rectifier circuit converts the bias power signal, as received from the first circuit means through the second coupling transformer, from an alternating current signal to a direct current signal impressed across the voltage divider circuit. The voltage divider circuit converts the direct current signal received from the rectifier circuit to a source of bias voltage which is stored as an electrical charge in storage capacitors within the voltage divider circuit and supplied to the latching switch circuit. The latching switch circuit impresses a bias voltage of proper polarity across the gate-emitter junction of the power transistor in response to trigger signals generated by the first circuit means, and coupled to the second circuit means via the second coupling transformer in response to the control signal supplied to the first circuit means by the external control circuit.

The gate drive of the preferred embodiment is configured in a manner such that the bias power signal is continuously coupled between the first and second circuit means whenever the control signal is present, thereby commanding the gate drive to maintain the power transistor in the OFF state, and also thereby continuously replenishing the electrical charge on the storage capacitors during the OFF state. The gate drive of the preferred embodiment is further configured such that the latching switch circuit within the second circuit means applies a continuous reverse-bias signal across the gate-emitter junction of the power transistor during the OFF state, thereby providing protection against spurious turn ON of the power transistor.

When switching is initiated by the latching switch circuit within the second circuit means of the preferred embodiment of the invention, in response to the control signal, energy stored in the storage capacitors during the OFF state is utilized to increase switching speed by quickly extinguishing accumulated charge carriers within the power transistor. The energy stored in the storage capacitors is also used by the latching switch circuit to create and maintain a forward-bias voltage across the gate-emitter junction of the power transistor, thereby causing the power transistor to turn ON and remain in the ON state.

The various circuits of the first and second circuit means of the preferred embodiment, as described hereinbefore, in conjunction with the first and second coupling transformers, provide a convenient electrical interface between the external control circuit and the power transistor.

The steady-state protection circuit within the second circuit means of the preferred embodiment provides a continuous periodic retriggering pulse signal to the latching switch circuit whenever the bias power signal is coupled to the second circuit means. The retriggering pulse signal causes the latching switch circuit to continually reset, during the OFF state, to the condition wherein the reverse-bias signal is impressed across the gate-emitter junction of the power transistor, thereby continually resetting the power transistor to the OFF state. The retriggering pulse signal provides pulses recurring at a periodic rate sufficiently high such that, should the latching switch circuit be inadvertently triggered by spurious signals or electrical noise signals, the retriggering pulse signal will cause the latching switch circuit to reset and return the power transistor to the OFF state before the power transistor or circuitry in which the power transistor is being utilized are damaged by the inadvertent turn ON. Incorporation of the steady-state protection circuit into the gate drive of the preferred embodiment provides additional protection against inadvertent turn ON of the power transistor in comparison to prior gate drives.

The transient protection circuit of the preferred embodiment provides protection against inadvertent turn ON of the power transistor due to transient forward bias voltages being impressed across the gate-emitter junction of the power transistor as the bias voltage power supply is charged or discharged during initial power-up and shut-down of the gate drive, or in other operating conditions wherein the voltage stored within the storage capacitors of the voltage divider may be insufficient to maintain the latching switch circuit in the OFF state.

Other advantages and advancements in the state of the art provided by the gate drive of the instant invention will become apparent from the following specification, taken in connection with the accompanying drawings.

DESCRIPTION OF THE PREFERRED EMBODIMENT

Figure 1:
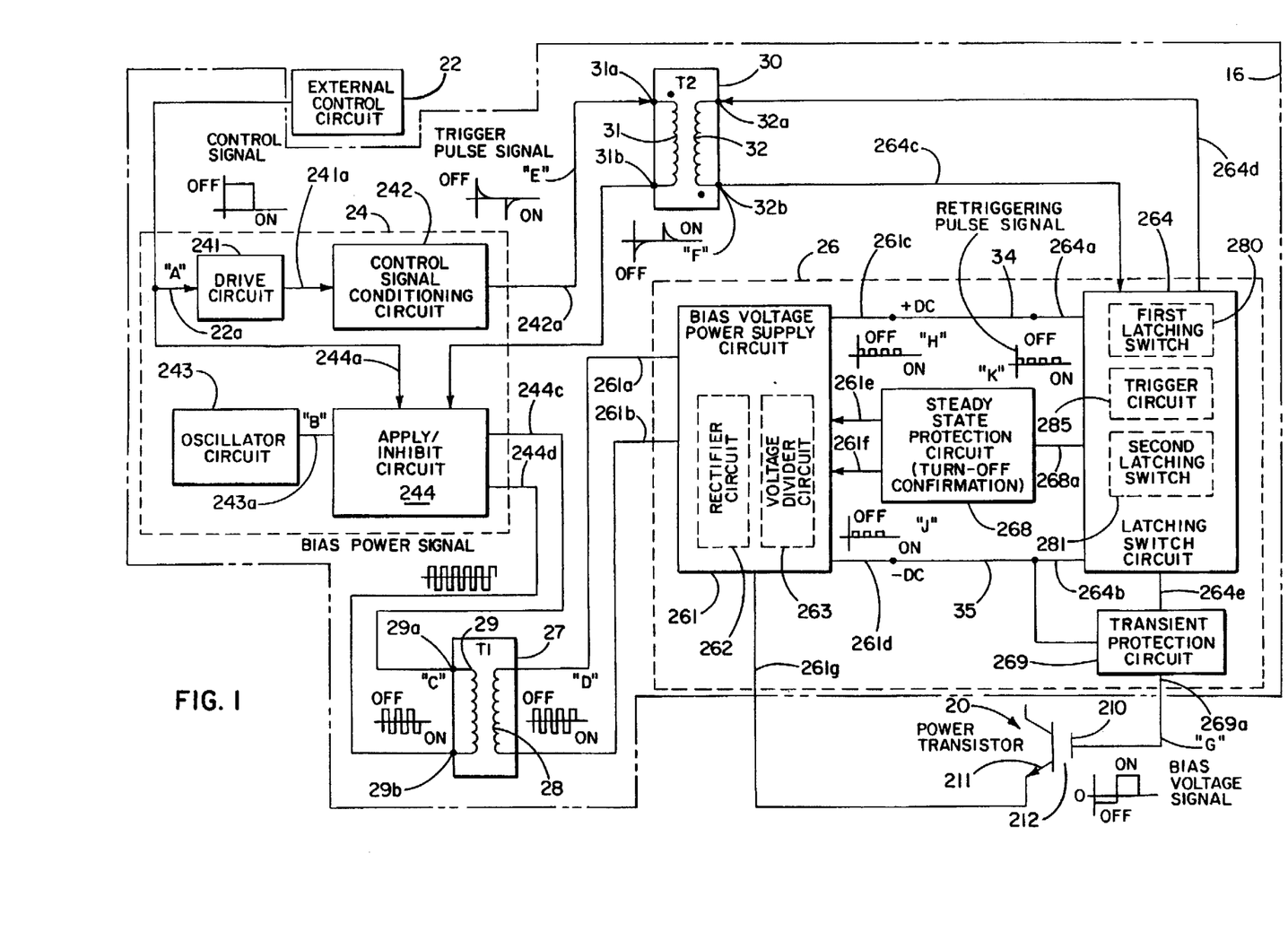
FIG. 1 is a block diagram of a gate drive for a power transistor embodying the invention.

Reference is now made to FIG. 1 which illustrates a gate drive circuit 16 embodying the invention that controls the application of bias voltage across a power transistor 20 in response to a control signal supplied to the gate drive circuit 16 by an external control circuit 22. As seen in FIG. 1, the gate drive circuit 16 includes, as illustrated within dashed lines, two major groupings of circuit components which comprise a first circuit means 24 and a second circuit means 26, with the first and second circuit means 24, 26 being coupled to one another through a first coupling transformer (T1) 27 and a second coupling transformer (T2) 30.

The first circuit means 24 includes a drive circuit 241 which is electrically coupled via lead 22a to the external control circuit 22 for receipt of the control signal, and further electrically coupled in a series circuit relationship sequentially through a lead 241a, to a pulse conditioning circuit 242, and a lead 242a, to a first terminal 31 a of a primary winding 31 of the second coupling transformer 30. The first circuit means 24 further includes an oscillator circuit 243 which generates an alternating current bias power signal electrically coupled via lead 243a to an apply/inhibit circuit 244. The apply/inhibit circuit 244 is coupled to a second terminal 31b of the primary winding 31. In addition, the circuit 244 impresses the bias power signal generated by the oscillator circuit 243 across a primary winding 29 of the first coupling transformer 27 via leads 244c, 244d attached to alternate electrical ends of primary winding 29 at terminals 29a, 29b, respectively, in response to the control signal which is electrically coupled from the external control circuit 22 to the apply/inhibit circuit 244 via lead 244a which is in turn coupled to lead 22a.

The second circuit means 26 includes a bias voltage power supply circuit 261 having a rectifier circuit 262 and a voltage divider circuit 263. The bias voltage power supply circuit 261 is coupled across a secondary winding 28 of the first coupling transformer 27 for receipt via leads 261a, 261b of the alternating current bias power signal generated by the oscillator circuit 243 of the first circuit means 24. The rectifier circuit 262 within the bias voltage power supply 261 converts the bias power signal from an alternating current signal to a direct current signal which is impressed across the voltage divider circuit 263. The voltage divider circuit 263 converts the direct current signal received from the rectifier circuit 262 to a source of bias voltage which is stored within the voltage divider circuit 263 and supplied to a positive bus 34 within the second circuit means 26, and to a negative bus 35 within the second circuit means 26 via leads 261c, 261d, respectively. The bias voltage power supply 261 is further electrically connected via lead 261g to an emitter electrode 211 of the power transistor 20.

The second circuit means 26 also includes a latching switch circuit 264 electrically coupled to the positive bus 34 and the negative bus 35 of the second circuit means 26 via leads 264a, 264b, respectively. The latching switch circuit 264 is also electrically coupled across a secondary winding 32 of the second coupling transformer 30 for receipt of the trigger pulse signal from the first circuit means 24 via lead 264d connected to a first terminal 32a of the secondary winding 32 of the second coupling transformer 30, and via lead 264c connected to a second terminal 32b of the secondary winding 32 of the second coupling transformer 30. The latching switch circuit 264 is internally configured and further electrically coupled via leads 264e, 269a to and through a transient protection circuit 269 to a gate electrode 210 of the power transistor 20 in a such a manner that the latching switch circuit 264 will cause bias voltages of proper polarity to be applied to the gate electrode 210 of the power transistor 20 to cause the power transistor 20 to switch states and to remain in either an ON state or an OFF state in response to the trigger pulse signal received from the first circuit means 24.

The transient protection circuit 269 of the preferred embodiment provides protection against inadvertent turn ON of the power transistor 20 due to transient forward bias voltages being impressed across a gate-emitter junction 212 of the power transistor 20 as the bias voltage power supply circuit 261 is charged or discharged during initial power-up and shut-down of the gate drive 16, or in other operating conditions wherein the voltage stored within the voltage divider circuit 263 of the bias power supply 261 may be insufficient to maintain the latching switch circuit 264 in the OFF state.

The second switch means 26 further includes a steady-state protection circuit 268 electrically connected via lead 261e and lead 261f to the bias voltage power supply circuit 261, and further connected via lead 268a to the latching switch circuit 264. The steady-state protection circuit 268 provides a continuous periodic retriggering pulse signal to the latching switch circuit 264 whenever the bias power signal is coupled to the second circuit means 24.

Reference is now made to FIGS. 2–10 which illustrate the waveforms present during the OFF state and during the ON state at various points within the gate drive 16 configuration of FIG. 1. For the purpose of illustration, the waveforms as depicted in FIGS. 2–10 have been given an exaggerated appearance in order to facilitate understanding of the operation of the invention.

Figures 2, 3:
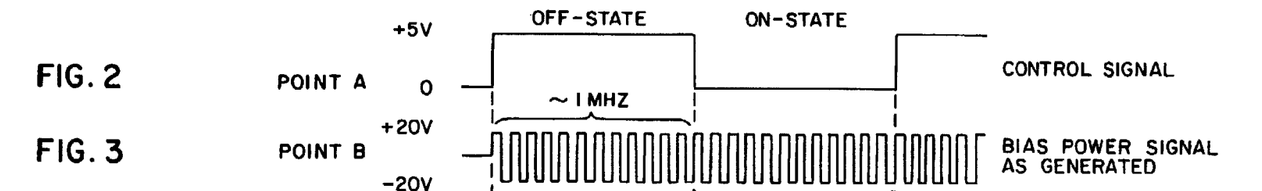
FIGS. 2–10 are graphs representing waveforms present at various points in the circuit of FIG. 1.

FIG. 2 shows the control signal at point A on lead 22a from the external control circuit 22 of FIG. 1. The control signal is a low voltage low amperage signal typical of signals generated by microprocessor based digital control circuits. The signal is held at a "high" value of approximately +5 volts DC for the duration of the OFF state and is held at a "low" value of approximately 0 volts DC for the duration of the ON state by the external control circuit 22.

FIG. 3 shows the bias power signal at point B on lead 243a of FIG. 1 as generated by the oscillator circuit 243 of FIG. 1. The bias power signal is an alternating current signal such as a square wave having a frequency of approximately 1 megahertz and an amplitude of approximately +20 volts to approximately −20 volts.

Figure 4:
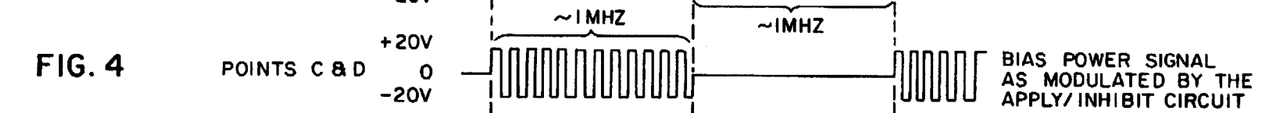

In the manner previously described with reference to FIG. 1, the apply/inhibit circuit 244 causes the bias power signal generated by the oscillator 243 to be impressed across the primary winding 29 of the first coupling transformer 27 in response to the control signal, as shown in FIG. 2, with the control signal being coupled from point A of FIG. 1 to the apply/inhibit circuit 244 by lead 244a, resulting in a waveform as shown in FIG. 4 being coupled by magnetic induction across the first coupling transformer 27 as shown at points C and D of FIG. 1. The bias power signal at point D is coupled via leads 261a, 261b to the bias voltage power supply circuit 261 of the second circuit means 26. In the manner previously described with reference to FIG. 1, the rectifier circuit 262 and the voltage divider circuit 263, within the bias voltage power supply circuit 261, convert the alternating square wave bias power signal as shown in FIG. 4 at point D of FIG. 1 into a source of bias voltage which is stored within the voltage divider circuit 263 and supplied to a positive bus 34 within the second circuit means 26, and to a negative bus 35 within the second circuit means 26 via leads 261c, 261d, respectively, such that a full voltage potential of approximately +20 volts is established between the positive and negative buses 34, 35.

Figure 5:
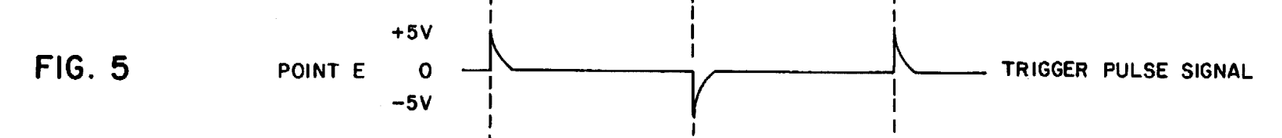
Figure 6:
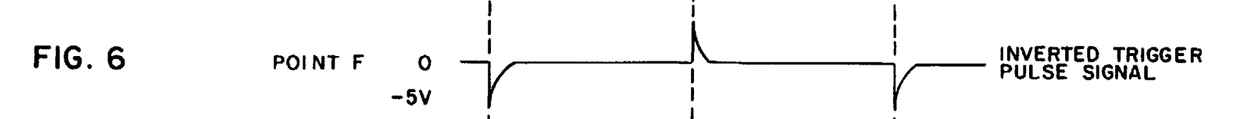

Also, in the manner previously described with reference to FIG. 1, the control signal from the external control circuit 22 as shown in FIG. 2 and at point A of FIG. 1, is converted by the drive circuit 241 and control signal conditioning circuit 242 of the first circuit means 24 into a trigger pulse signal as shown in FIG. 5 and present at point E of FIG. 1. The trigger pulse signal as shown in FIG. 5 is impressed across the primary winding 31, of the second coupling transformer 30 and coupled by magnetic induction to the secondary winding 32 of the second coupling transformer 30. The primary and lo secondary windings 31, 32 of second coupling transformer 30 of the preferred embodiment of the invention are directionally wound such that the trigger pulse signal is inverted during the magnetic coupling process, with the resultant inverted trigger pulse signal appearing at terminal 32b of the second coupling transformer 30 as shown in FIG. 6 and at point F of FIG. 1.

Figure 7:
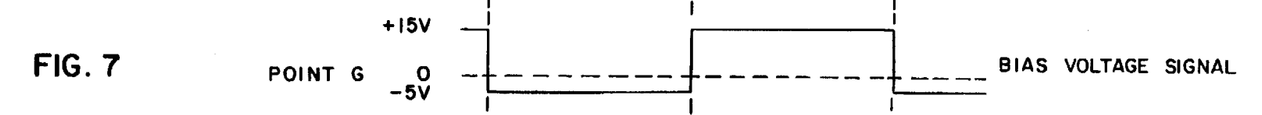

As previously described with reference to FIG. 1, the latching switch circuit 264 of the second circuit means 26 is coupled across the positive and negative buses 34, 35 of the second circuit means 26 via leads 264a, 264b, respectively, for receipt of the bias voltage stored within the voltage divider circuit 263 of the bias voltage power supply circuit 261. The latching switch circuit 264 is also coupled across the secondary winding 32 of the second coupling transformer 30 for receipt of the inverted trigger pulse signal as shown in FIG. 5 via leads 264c, 264d connected respectively to terminals 32b, 32a of the secondary winding 32 of the second coupling transformer 30. As previously described with reference to FIG. 1, the latching switch circuit 264 and the bias voltage power supply circuit 261 are internally configured and electrically coupled such that, under normal operating conditions, the latching switch circuit 264 will cause bias voltages of the proper polarity, as shown in FIG. 7 and at point G of FIG. 1, to be applied between the gate electrode 210 and the emitter electrode 211 of the power transistor 20, thereby causing the power transistor 20 to switch states and to remain in either an ON state or an OFF state in response to the inverted trigger pulse signal as shown in FIG. 6 and at point F on line 264c of FIG. 1.

Figure 8:
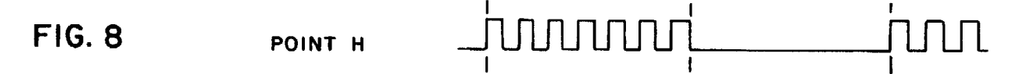
Figure 9:
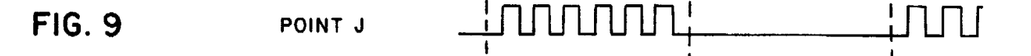
Figure 10:
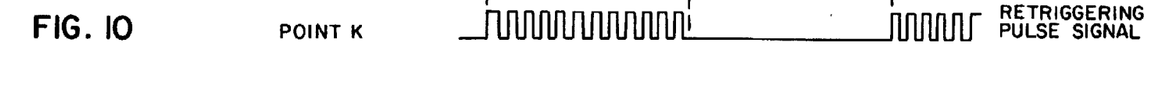

The steady-state protection circuit 268 is internally configured and connected, as previously described with respect to FIG. 1, between the bias voltage power supply 261 and the latching switch circuit 264 of the preferred embodiment of the invention in such a manner-that, during the OFF state, two square wave signals having a relative phase shift of approximately 180 degrees and a frequency equal to the bias power signal of FIG. 2 are generated on leads 261e, 261f, respectively, as shown in FIGS. 8 and 9 and at points H and J, respectively, of FIG. 1. The two phase-shifted square waves of FIGS. 8 and 9 are superimposed within the steady-state protection circuit 268 to form a retriggering pulse signal, as shown in FIG. 10 and at point K of FIG. 1, having a frequency of twice the frequency of the bias power signal which is coupled to the latching switch circuit 264 via lead 268a.

The transient protection circuit 269 is internally configured and electrically connected in a manner such that, during transitional operating conditions when the voltage divider 263 is insufficiently charged to maintain the full voltage potential of approximately +20 volts, as previously described, across the positive and negative buses 34, 35 of the second circuit means 26, the transient protection circuit 269 will prevent positive-bias voltages below a pre-selected threshold value of approximately 1.2 volts from being impressed across the gate and emitter electrodes 210, 211 of the power transistor 20, thereby preventing inadvertent turn ON of the power transistor 20 due to ineffective latching of the latching switch circuit 264 during transitional operating conditions.

Figure 11:
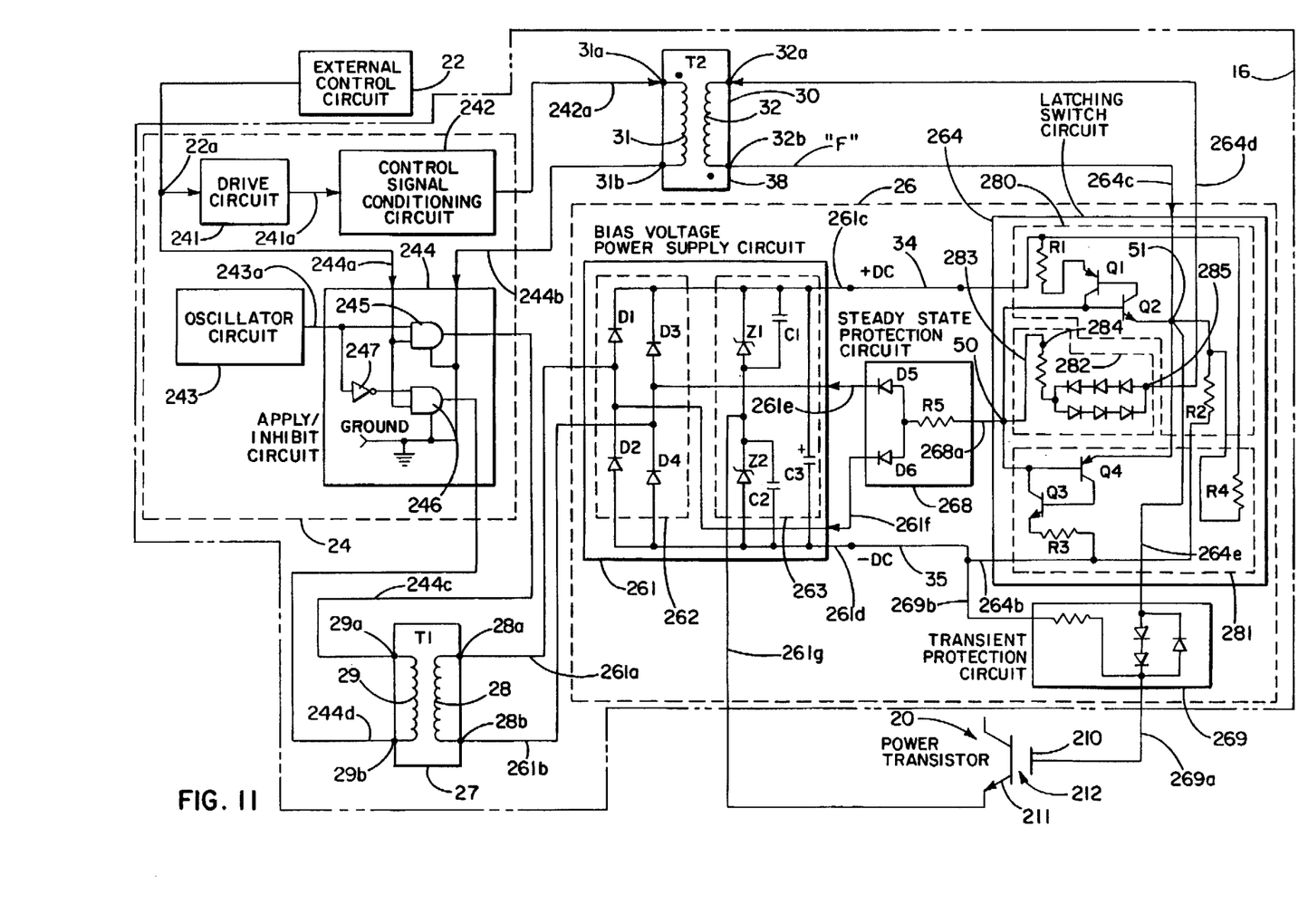
FIG. 11 circuit schematic of the gate drive depicted in FIG. 1.

Reference is now made to FIG. 11 which illustrates a partial simplified schematic of the preferred embodiment of the invention. The reference numerals used throughout FIG. 11 are the same as employed in FIG. I to designate identical components. The waveforms A through K, illustrated in FIGS. 2–10, also apply to the operation of the embodiment of the invention as it is illustrated in FIG. 11. The comments with respect to these waveforms noted hereinbefore apply equally to the circuit of FIG. 11. The operation of FIG. 11 is therefore identical to the more generalized block diagram of FIG. 1; however, a number of the component circuits depicted as blocks in the diagram of FIG. 1 are now shown in FIG. 11 with selected details of their electrical circuit components shown interconnected.

The external control unit 22, the drive circuit 241, the control signal conditioning circuit 242, and the oscillator circuit 243 are of conventional construction and are therefore shown, without additional detail, in FIG. 11 only for the purpose of defining interconnections within the gate drive circuit 16 of the preferred embodiment of the invention.

As shown in FIG. 11, the apply/inhibit circuit 244 includes logic circuitry comprising a first AND gate 245, a second AND gate 246, and an INVERTER gate 247. The first AND gate has a first input connected to lead 243a within the first circuit means 24 for receipt of the bias power signal from the oscillator circuit 243, and a second input connected to lead 244a within the first circuit means 24 for receipt of the control signal from the external control circuit 22. The first AND gate 245 further has an output connected to lead 244c within the first circuit means 24 such that when the bias power signal is of positive polarity and present at the first input to the first AND gate 245, and when the control signal is of positive polarity and present at the second input to the first AND gate 245, the first AND gate 245 will cause the first circuit means 24 to apply the bias power signal across the primary winding 29 of the first coupling transformer 27.

The INVERTER gate 247 has an input connected to lead 243a within the first circuit means 24 for receipt of the bias power signal from the oscillator circuit 243 and an output connected to and through a first input of the second AND gate 246 to an output of the second AND gate 246, said output being connected to lead 244d. The second AND gate 246 further has a second input connected to lead 244a within the first circuit means 24 for receipt of the control signal from the external control circuit 22. The INVERTER gate 247 and the second AND gate 246 are connected within the first circuit means 24 in such a manner that when the bias power signal is of negative polarity and present at the input to the INVERTER gate 247, the INVERTER gate 247 will convert the negative polarity bias power signal to a positive polarity bias power signal applied to the first input of the second AND gate 246. The output of the second AND gate 246 is connected within the first circuit means 24 such that when the bias power signal of positive polarity is applied to the first terminal of the second AND gate 246 by the INVERTER gate 247, and when the control signal is of positive polarity and present at the second input to the second AND gate 247, the second AND gate 247 will apply the bias power signal across the primary winding 29 of the first coupling transformer 27. The first and second AND gates 245, 246 inhibit the bias power signal when the control signal of positive polarity is not present at the second inputs of the first and second AND gates 245, 246.

The bias voltage power supply circuit 261 of the second circuit means 26, as shown in FIG. 11, has internal electrical components configured as indicated by dashed lines in FIG. 11 to form a rectifier circuit 262 and a voltage divider circuit 263. Specifically, the rectifier circuit 262 is comprised of four diodes, D1, D2, D3, D4, connected to form a full-wave bridge rectifier having inputs connected to terminals 28a, 28b of the secondary winding 28 of the first coupling transformer 27, and having first and second outputs connected respectively to the positive bus 34 and to the negative bus 35 within the second circuit means 26. The voltage divider circuit 263 is comprised of a first storage capacitor C1 and a second storage capacitor C2. The first storage capacitor C1 has a first terminal connected to the positive bus 34 of the second circuit means 26 and a second terminal connected to and through the second storage capacitor C2 to the negative bus 35 of the second circuit means 26. The second terminal of the first storage capacitor C1 is also electrically connected via lead 261g to the emitter electrode 211 of the power transistor 20. The voltage divider 263 also includes a first zener diode Z1 and a second zener diode Z2 connected in parallel across the first and second storage capacitors C1, C2, respectively, for limiting the magnitude of voltages impressed across the first and second storage capacitors C1, C2 to pre-selected values. In the preferred embodiment of the invention, the preselected values are approximately 15 volts across the first storage capacitor C1 and approximately 5 volts across the second storage capacitor C2. The voltage divider circuit 263 further includes an auxilliary storage capacitor C3 connected between the positive and negative buses 34, 35.

The rectifier circuit 262 converts the bias power signal received from the secondary winding 28 of the first coupling transformer 27 during the OFF state to a direct current signal impressed across the voltage divider circuit 263. The voltage divider circuit 263 converts the direct current signal received from the rectifier circuit 262 during the OFF state to a source of bias voltage stored in the first and second storage capacitors C1, C2 and impressed across the positive and negative buses 34, 35 of the second circuit means 26 with the auxilliary storage capacitor C3 converting the direct current in the positive and negative buses 34, 35 to a source of voltage for rapidly replenishing the bias voltage stored in the first and second storage capacitors C1, C2 during periods in which the gate drive is caused, by the external control circuit 22, to switch at a rapid repetitive rate.

The latching switch circuit 264 of the second switch means 26, as shown in FIGS. 11 and 1, includes a first latching switch 280, a second latching switch 281, and a trigger circuit 282, electrically connected such that the first latching switch 280 conducts current and the second latching switch 281 blocks current when the power transistor 20 is in the ON state, and further electrically connected such that the second latching switch 281 conducts current and the first latching switch 280 blocks current when the power transistor 20 is in the OFF state. The first latching switch 280 is comprised Of first and second transistors Q1, Q2 with the first transistor Q1 being a PNP type transistor and the second transistor Q2 being an NPN type transistor. The first transistor Q1 has an emitter electrode connected to and through a first current limiting resistor R1 to the positive bus 34 of the second circuit means 26, a base electrode connected to a collector electrode of the second transistor Q2 of the first latching switch 280, and a collector electrode connected to a base electrode of the second transistor Q2 of the first latching switch 280. The emitter electrode of the second transistor Q2 of the first latching switch 280 is connected to and through a second current limiting resistor R2 to the negative bus 35 of the second circuit means 26.

The second latching switch 281 is comprised of a first transistor Q3 and a second transistor Q4, with the first transistor Q3 being an NPN type transistor and the second transistor Q4 being a PNP type transistor. The first transistor Q3 has an emitter electrode connected to and through a first current limiting resistor R3 to the negative bus 35 of the second circuit means 26, a base electrode connected to a collector electrode of the second transistor Q4 of the second latching switch 281, and a collector electrode connected to a base electrode of the second transistor Q1 of the first latching switch 280. The emitter electrode of the second transistor Q4 of the second latching switch 281 is connected to and through a second current limiting resistor R4 to the positive bus 35 of the second circuit means 26.

The latching switch circuit 264 further has first and second common terminals 50, 51 with the first common terminal 50 of the latching switch circuit 264 being electrically connected to the collector electrode of the first transistor Q1 of the first latching switch 280 and further electrically connected to the collector electrode of the first transistor Q3 of the second latching switch 281. The second common terminal 51 of the latching switch circuit being 264 is electrically connected to the emitter electrode of the second transistor Q2 of the first latching switch 281 and also electrically connected to the emitter electrode of the second transistor Q4 of the second latching switch 281.

The trigger circuit 282 has a first terminal 284 and a second terminal 285 with the first terminal 284 of the trigger circuit 282 being connected through lead 283 to the first common terminal 50 of the latching switch circuit 264, and the second terminal 285 of the trigger circuit 282 being connected via lead 264d in a series circuit relationship to and through the secondary winding 32 of the second coupling transformer 30 to the second common terminal 51 of the latching switch circuit 264. The trigger circuit 282 is constructed in a manner such that, when a trigger pulse signal having negative polarity as shown in FIG. 6, and at point F of FIGS. 1 and 11, is impressed across the secondary winding 32 of the second coupling transformer 30, the trigger circuit 282 causes the first common terminal 50 of the latching switch circuit 264 to momentarily become electrically negative relative to the second common terminal 51 of the latching switch circuit 264, thereby causing the first latching switch 280 to latch in a state blocking current, and also thereby causing the second latching switch 281 to latch in a state conducting current, and further thereby causing the power transistor 20 to turn OFF and to remain in an OFF state. The trigger circuit is also constructed in a manner such that, when a trigger pulse signal having positive polarity as shown in FIG. 6, and at point F of FIGS. 1 and 11, is impressed across the secondary winding 32 of the second coupling transformer 30, the trigger circuit 282 causes the first common terminal 50 of the latching switch circuit 264 to momentarily become electrically positive relative to the second common terminal 51 of the latching switch circuit 264, thereby causing the second latching switch 281 to latch in a state blocking current, and also thereby causing the first latching switch 280 to latch in a state conducting current, and further thereby causing the power transistor 20 to turn ON and to remain in an ON state.

The steady-state protection circuit 268 of the second circuit means 26, as shown in FIG. 11, includes a current limiting resistor R5 and first and second diodes D5, D6 with the current limiting resistor R5 being electrically connected to the first common terminal 50 of the latching switch circuit 264 and coupled to and through the first and second diodes D5, D6 to the first and second terminals 28b, 28a, respectively, of the secondary winding, 28 of the first coupling transformer 27. The first diode D5 of the steady-state protection circuit 268 has a cathode electrode coupled to the first terminal 28b of the secondary winding 28 of the first coupling transformer 27 and an anode connected to the current limiting resistor R5 of said steady-state protection circuit 268. The second diode D6 of the steady-state protection circuit has a cathode electrode coupled to the second terminal 28a of the secondary winding 28 of the first coupling transformer 27 and an anode electrode connected to the current limiting resistor R5 of the steady-state protection circuit 268.

With the steady-state protection circuit configured as shown in FIG. 11, a continuous periodic retriggering pulse signal, as shown in FIG. 10 and at point K of FIG. 1, is applied between the first and second common terminals 50, 51 of the latching switch circuit 264 at a periodic rate equal to twice the frequency of the bias power signal whenever the bias power signal is induced across the secondary winding 28 of the first coupling transformer 27, thereby causing the latching switch circuit 264 to continually reset at a periodic rate equal to twice the frequency of the bias power signal to the condition wherein the reverse-bias signal, as shown by the negative voltage portion of FIG. 7, is impressed across the gate-emitter junction 212 of the power transistor 20, and further thereby continually resetting the power transistor 20 to the OFF state.

It will be observed that the desired retriggering of the latching switch circuit 264 could also be achieved using either the first diode D5 or the second diode D6 alone, with the resulting retriggering pulse then being impressed across the first and second common terminals 50, 51 of the latching switch circuit 264 at a rate equal to the frequency of the bias power signal. If only the first diode D5 were utilized, the retriggering pulse at point K of FIG. 1 would have a waveform as shown in FIG. 8 at point H of FIG. 1. If only the second diode D6 were utilized, the retriggering pulse at point K would have a waveform as shown in FIG. 9 and at point J of FIGS. 1 and 11.

It will be appreciated that, through utilization of both the first and second diodes D5, D6, as shown in FIG. 11, the steady-state protection circuit 268 of the preferred embodiment provides improved protection against damage to the power transistor 20 resulting from inadvertent turn ON of the power transistor 20 when compared to embodiments utilizing only one diode, since the duration of an inadvertent ON state is only half as long as for circuits utilizing only one diode. It will be further appreciated that the steady-state protection circuit 268 of the preferred embodiment also provides a graceful failure mode of operation in that, should either the first or second diode D5, D6 of the steady-state protection circuit 268 fail, the latching switch circuit 264 would continue to be retriggered at a rate equal to the frequency of the bias power signal, thereby continuing to provide protection for the power transistor 20 against damage due to an inadvertent turn ON.

From the foregoing, it will be appreciated that, through utilization of separate coupling transformers for transmission of the bias power signal and the control signal between the first and second circuit means, the gate drive circuit of the instant invention provides a degree of dielectric isolation and noise immunity superior to prior transformer coupled gate drives. It will also be appreciated that the inclusion of the steady-state protection circuit and the transient protection circuits, and the capability to provide negative bias voltage to maintain the power transistor in an OFF state, as taught by the invention, allows construction of a gate drive which provides superior protection against inadvertent turn ON of the power transistor in comparison to prior gate drives.

It will be further appreciated that the inclusion of energy storage devices within the gate drive of the invention provides the capability to obtain very rapid switching rates by quickly extinguishing accumulated charge carriers within the power transistor at the moment switching is caused to occur.

It will be still further appreciated that the various circuits of the first and second circuit means of the preferred embodiment, as described hereinbefore, in conjunction with the first and second coupling transformers, also provide a convenient electrical interface between the external control circuit and the power transistor.

Although this invention has been illustrated and described in conjunction with particular embodiments thereof, it will be apparent to those skilled in the art that other combinations, modifications, and uses of the various features of the invention may be devised without departing from the spirit of the invention as set forth in the appended claims.

I claim:

1. A gate drive circuit for a power transistor providing improved dielectric isolation and protection against inadvertent turn ON of the power transistor, said gate drive circuit comprising:

first circuit means for providing a bias power signal and a trigger pulse signal in response to a control signal received by the first circuit means from an external control circuit connected to said first circuit means;

second circuit means connected across a gate electrode and an emitter electrode of the power transistor for providing a bias voltage signal impressed across a gate-emitter junction within the power transistor to cause said power transistor to switch between an ON state and an OFF state in response to said trigger pulse signal and bias power signal provided by said first circuit means;

a first coupling transformer connected between said first and second circuit means for coupling said bias power signal produced by said first circuit means to said second circuit means through magnetic induction; and a second coupling transformer connected between said first and second circuit means for coupling said trigger pulse signal produced by said first circuit means to said second circuit means through magnetic induction;

said first and second coupling transformers thereby providing separate pathways for coupling said bias power and trigger pulse signals between said first and second circuit means in a manner providing dielectric isolation between said first and second circuit means along each of said separate pathways;

wherein said second circuit means includes a steady-state protection circuit, said steady-state protection circuit developing a continuous periodic retriggering pulse signal whenever the bias power signal is induced across the first coupling transformer, said retriggering pulse signal causing the gate drive circuit to continually reset to a condition wherein a reverse-bias signal is impressed across the gate-emitter junction of the power transistor, thereby continually resetting the power transistor to the OFF state, said retriggering pulse signal having pulses recurring at a periodic rate sufficiently high such that, should the gate drive circuit be inadvertently triggered by spurious signals or electrical noise signals, thereby causing the power transistor to turn ON when the control signal is commanding the gate drive circuit to hold the power transistor in the OFF state, the retriggering pulse signal will cause the gate drive circuit to reset to a condition wherein the reverse-bias voltage is impressed across the gate-emitter junction of the power transistor, thereby causing the power transistor to turn OFF before the power transistor or circuitry in which the power transistor is being utilized are damaged.

2. A gate drive circuit for a power transistor providing improved dielectric isolation and protection against inadvertent turn ON of the power transistor, said gate drive circuit comprising:

first circuit means for providing a bias power signal and at least one trigger pulse signal to a second circuit means in response to a control signal from an external control circuit connected to said first circuit means;

said bias power signal being coupled from the first circuit means to the second circuit means by magnetic induction through a first coupling transformer having a primary winding electrically connected to the first circuit means and a secondary winding electrically connected to the second circuit means;

said trigger pulse signal being coupled from the first circuit means to the second circuit means by magnetic induction through a second coupling transformer having a primary winding electrically connected to the first circuit means and a secondary winding electrically connected to the second circuit means, said first and second coupling transformers thereby providing separate pathways for coupling of the bias power signal and the trigger pulse signal between the first and second circuit means, said first and second coupling transformers further providing dielectric isolation between the first and second circuit means along each of the separate pathways;

said second circuit means being connected between a gate electrode and an emitter electrode of the power transistor and providing a reverse-bias voltage signal impressed across a gate-emitter junction within the power transistor when the control signal is supplied to the first circuit means by the external control circuit, thereby causing the power transistor to turn OFF and to remain in an OFF state; and said second circuit means further providing a forward bias voltage impressed across the gate-emitter junction of the power transistor when the control signal is at zero potential, thereby causing the power transistor to turn ON and to remain in an ON state;

wherein said first circuit means includes an oscillator circuit and an apply/inhibit circuit, said oscillator circuit being electrically coupled to and through said apply/inhibit circuit to the primary winding of the first coupling transformer, said oscillator circuit generating the bias power signal and said apply/inhibit circuit controlling application of the bias power signal to the primary winding of the first coupling transformer.

3. The gate drive circuit of claim 2 wherein the control signal from the external control circuit is electrically coupled to the apply/inhibit circuit, the presence of said control signal causing the apply/inhibit circuit to apply the bias power signal across the primary winding of the first coupling transformer, thereby allowing the bias power signal to be coupled between the first and second circuit means by magnetic induction through the first coupling transformer whenever the gate drive circuit is maintaining the power transistor in the OFF state, the absence of said control signal causing the apply/inhibit circuit to inhibit the bias power signal so that the bias power signal is not impressed across the primary winding of the first coupling transformer, thereby inhibiting coupling of the bias power signal between the first and the second circuit means whenever the gate drive circuit is maintaining the power transistor in the ON state.

4. The gate drive circuit of claim 2 wherein the first circuit means includes a control signal conditioning circuit for converting the control signal to a trigger pulse signal, said control signal conditioning circuit being electrically connected between the external control circuit and the primary Winding of the second coupling transformer.

5. The gate drive circuit of claim 4 wherein the first circuit means includes a drive circuit for converting the control signal from a low current signal to a high current signal, said drive circuit being electrically connected between the external control circuit and the control signal conditioning circuit.

6. The gate drive circuit of claim 2 wherein said apply/inhibit circuit includes logic circuitry comprising a first AND gate, a second AND gate, and an INVERTER gate, said first AND gate having a first input connected within the first circuit means for receipt of the bias power signal from the oscillator circuit, said first AND gate also having a second input connected within the first circuit means for receipt of the control signal from the external control circuit, said first AND gate further having an output connected within the first circuit means such that when the bias power signal is of positive polarity and present at the first input to the first AND gate, and when the control signal is of positive polarity and present at the second input to the first AND gate, the first AND gate will cause the first circuit means to apply the bias power signal across the primary winding of the first coupling transformer, said INVERTER gate having an input connected within the first circuit means for receipt of the bias power signal from the oscillator, and an output connected to and through a first input of said second AND gate to an output of said second AND gate, said second AND gate further having a second input connected within the first circuit means for receipt of the control signal from the external control circuit, said INVERTER gate and said second AND gate being connected within the first circuit means in such a manner that, when the bias power signal is of negative polarity and present at the input to the INVERTER gate, said INVERTER gate will convert said negative polarity bias power signal to a positive polarity bias power signal applied to the first input of said second AND gate, said output of said second AND gate connected within the first circuit means such that when the bias power signal of positive polarity is applied to the first terminal of the second AND gate by the INVERTER gate, and when the control signal is of positive polarity and present at the second input to the second AND gate, the second AND gate will cause the first circuit means to apply the bias power signal across the primary winding of the first coupling transformer, said first and second AND gates further causing the first circuit means to inhibit the bias power signal when the control signal is not of positive polarity and present at the second inputs of said first and second AND gates.

7. A gate drive circuit for a power transistor providing improved dielectric isolation and protection against inadvertent turn ON of the power transistor, said gate drive circuit comprising:

first circuit means for providing a bias power signal and at least one trigger pulse signal to a second circuit means in response to a control signal from an external control circuit connected to said first circuit means;

said bias power signal being coupled from the first circuit means to the second circuit means by magnetic induction through a first coupling transformer having a primary winding electrically connected to the first circuit means and a secondary winding electrically connected to the second circuit means;

said trigger pulse signal being coupled from the first circuit means to the second circuit means by magnetic induction through a second coupling transformer having a primary winding electrically connected to the first circuit means and a secondary winding electrically connected to the second circuit means, said first and second coupling transformers thereby providing separate pathways for coupling of the bias power signal and the trigger pulse signal between the first and second circuit means, said first and second coupling transformers further providing dielectric isolation between the first and second circuit means along each of the separate pathways;

said second circuit means being connected between a gate electrode and an emitter electrode of the power transistor and providing a reverse-bias voltage signal impressed across a gate-emitter junction within the power transistor when the control signal is supplied to the first circuit means by the external control circuit, thereby causing the power transistor to turn OFF and to remain in an OFF state; and said second circuit means further providing a forward bias voltage impressed across the gate-emitter junction of the power transistor when the control signal is at zero potential, thereby causing the power transistor to turn ON and to remain in an ON state;

wherein the second circuit means includes a bias voltage power supply circuit and a latching switch circuit, said bias voltage power supply circuit being electrically connected across the secondary winding of the first coupling transformer and having first and second outputs electrically connected respectively to a positive bus and a negative bus within the second circuit means, said bias voltage power supply further having a third output electrically connected to fie emitter electrode of the power transistor, said latching switch circuit being electrically coupled across the secondary winding of the second coupling transformer and having a bias voltage input terminal electrically connected to said positive bus within the second circuit means, a bias voltage return terminal electrically connected to said negative bus within the second circuit means, and a gate connection terminal electrically connected to the gate electrode of the power transistor, said bias voltage power supply converting the bias power signal received during the OFF state from the secondary winding of the first coupling transformer to a source of direct current and bias voltage for said latching switch circuit, said latching switch circuit impressing the reverse-bias voltage across the gate-emitter junction of the power transistor in response to a first trigger pulse signal coupled between the first and second circuit means by magnetic induction across the second coupling transformer when the control signal is supplied to the first circuit means by the external control circuit, thereby causing the power transistor to turn OFF, and also thereby maintaining the power transistor in the OFF state for the duration of the control signal, said latching switch circuit impressing the forward-bias voltage across the gate-emitter junction of the power transistor in response to a second trigger pulse signal coupled between the first and second circuit means by magnetic induction across the second coupling transformer when the control signal is removed from the first circuit means by the external control circuit, thereby causing the power transistor to turn ON and to remain in the ON state.

8. The gate drive circuit of claim 7 wherein said bias power supply circuit includes a rectifier circuit and a voltage divider circuit, said rectifier circuit being electrically coupled across the secondary winding of the first coupling transformer, said rectifier circuit also being electrically connected to and through said voltage divider circuit to the latching switch circuit, said rectifier circuit converting the bias power signal received from the secondary winding of the first coupling transformer to a direct current signal impressed across said voltage divider circuit, said voltage divider circuit converting the direct current signal received from said rectifier to a source of bias voltage impressed across the latching switch circuit.

9. The gate drive circuit of claim 7 wherein the second circuit means includes a steady-state protection circuit electrically connected across the secondary winding of the first coupling transformer and also electrically connected to the latching switch circuit, said steady-state protection circuit providing a continuous periodic retriggering pulse signal to the latching switch circuit whenever the bias power signal is induced across the secondary winding of the first coupling transformer, said retriggering pulse signal causing the latching switch circuit to continually reset to the condition wherein the reverse-bias signal is impressed across the gate-emitter junction of the power transistor, thereby continually resetting the power transistor to the OFF state, said retriggering pulse signal having pulses recurring at a periodic rate sufficiently high such that, should the latching switch circuit be inadvertently triggered by spurious signals or electrical noise signals, thereby causing the power transistor to turn ON when the control signal is commanding the gate drive circuit to hold the power transistor in the OFF state, the retriggering pulse signal will cause the latching switch circuit to reset to a condition wherein the reverse-bias voltage is impressed across the gate-emitter junction of the power transistor, thereby causing the power transistor to turn OFF before the power transistor or circuitry in which the power transistor is being utilized are damaged.

10. The gate drive circuit of claim 7 wherein the second circuit means further includes a transient protection circuit electrically connected in a series circuit arrangement between the latching switch circuit and the gate electrode of the power transistor in a manner such that gate current flowing across the gate-emitter junction of the power transistor due to forward and reverse-bias voltages impressed across the gate-emitter junction of the power transistor also flows through said transient protection circuit, said transient protection circuit providing protection against spurious turn ON of the power transistor due to transient forward bias voltages being impressed across the gate-emitter junction of the power transistor as the bias voltage power supply is charged or discharged during power-up and shut-down of the gate drive circuit, said protection against spurious turn ON being accomplished by said transient protection circuit providing a preselected value of threshold resistance between the latching switch circuit and the gate electrode of the power transistor which must be overcome by transient forward bias voltages impressed across the series circuit combination of the transient protection circuit and the gate-emitter junction of the power transistor before the transient forward-bias voltages are impressed across the gate-emitter junction of the power transistor, said value of threshold voltage being selected at or above a minimum forward-bias voltage corresponding to an operating condition for the gate drive circuit at which a minimum value of voltage exists across the positive and negative buses of the second circuit means whereby the latching switch circuit remains latched in the OFF state, thereby preventing undesired spurious turn ON of the power transistor should the latching switch circuit unlatch from the OFF state due to charging or discharging of the bias voltage power supply during power-up or shut-down of the gate drive circuit.

11. The gate drive circuit of claim 7 wherein said bias voltage power supply circuit includes, a rectifier circuit comprising four diodes connected to form a full wave bridge rectifier having inputs connected to opposite ends of the secondary winding of the first coupling transformer, and having first and second outputs connected respectively to the positive bus and to the negative bus within the second circuit means.

a voltage divider circuit comprising first and second storage capacitors, said first storage capacitor having a first terminal connected to the positive bus of the second circuit means and having a second terminal connected to and through said second storage capacitor to the negative bus of the second circuit means, said second terminal of said first storage capacitor also being electrically connected to the emitter electrode of the power transistor, said voltage divider also having first and second zener diodes connected across the first and second storage capacitors, respectively, for limiting the magnitude of voltages across said first and second storage capacitors to pre-selected values, said voltage divider further having an auxiliary storage capacitor connected across fie positive and negative buses, said rectifier circuit converting the bias power signal received from the secondary winding of the first coupling transformer to a direct current signal impressed across said voltage divider circuit, said voltage divider circuit converting the direct current signal received from said rectifier during the OFF state to a source of bias voltage stored in the first and second storage capacitors and impressed across the latching switch circuit with said auxilliary storage capacitor converting the direct current in the positive and negative buses to a source of voltage for rapidly replenishing the bias voltage stored in the first and second storage capacitors during periods in which the gate drive circuit is caused by the external control circuit to switch at a rapid repetitive rate.

12. The gate drive circuit of claim 7 wherein said latching switch circuit includes first and second latching switches and a trigger circuit electrically connected within the second circuit means such that, said first latching switch conducts current, and said second latching switch blocks current when the power transistor is in the ON state, and such that, said second latching switch conducts current, and said first latching switch blocks current when the power transistor is in the OFF state.

said first latching switch comprising first and second transistors, said first transistor being a PNP type transistor and said second transistor being an NPN type transistor, said first transistor having an emitter electrode connected to and through a first current limiting resistor of the first latching switch to the positive bus of the second circuit means, a gate electrode connected to a collector electrode of said second transistor of said first latching switch, and a collector electrode connected to a gate electrode of said second transistor of said first latching switch, the emitter electrode of said second transistor of said first latching switch being connected to and through a second current limiting resistor of the first latching switch to the negative bus of the second circuit means.

said second latching switch first and second transistors, said first transistor being an NPN type transistor, and said second transistor being a PNP type transistor, said first transistor having an emitter electrode connected to and through a first current limiting resistor of the second latching switch to the negative bus of the second circuit means, a gate electrode connected to a collector electrode of said second transistor of said second latching switch, and a collector electrode connected to a gate electrode of said second transistor of said first latching switch, the emitter electrode of said second transistor of said second latching switch being connected to and through a second current limiting resistor of the second latching switch to the positive bus of the second circuit means, said latching switch circuit further having first and second common terminals, said first common terminal of said latching switch circuit being electrically connected to the collector electrode of the first transistor of the first latching switch and to the collector electrode of the first transistor of the second latching switch, said second common terminal of said latching switch circuit being electrically connected to the emitter electrode of the second transistor of the first latching switch and to the emitter electrode of the second transistor of the second latching switch, said trigger circuit having first and second terminals, said first terminal of said trigger circuit being connected to the first common terminal of the latching switch circuit, and said second terminal of said trigger circuit being connected in a series circuit relationship to and through the secondary winding of the second coupling transformer to the second common terminal of the latching switch circuit, said trigger circuit being constructed and connected in a manner such that, when a TURN-OFF trigger pulse signal is impressed across the secondary winding of the second coupling transformer, said trigger circuit causes the first common terminal of the latching switch circuit to become electrically negative relative to the second terminal of the latching switch circuit thereby causing the first latching switch to latch in a state blocking current and also thereby causing the second latching switch to latch in a state conducting current, thereby causing the power transistor to turn OFF and to remain in an OFF state, said trigger circuit also being constructed and connected to said secondary winding of said second coupling transformer in a manner such that, when a TURN-ON trigger pulse signal is impressed across the secondary winding of the second coupling transformer, said trigger circuit causes the first common terminal of the latching switch circuit to become electrically positive relative to the second common terminal of the latching switch circuit thereby causing the second latching switch to latch in a state blocking current, and also thereby causing the first latching switch to latch in a state conducting current, thereby causing the power transistor to turn ON and to remain in an ON state.

13. The gate drive circuit of claim 12 wherein said trigger circuit includes a trigger current limiting resistor and first and second diodes, said trigger current limiting resistor being electrically connected to the first terminal of said trigger circuit and also coupled to and through said first and second diodes to the second terminal of the trigger circuit, said first diode having an anode electrode coupled to the second terminal of said trigger circuit and a cathode electrode connected in a series circuit relationship to and through said current limiting resistor to the first terminal of said trigger circuit, said second diode of said trigger circuit being connected in an antiparallel arrangement with respect to said first diode, said second diode having a cathode electrode coupled to the second terminal of said trigger circuit and an anode electrode connected in a series circuit relationship to and through said trigger current limiting resistor to the first terminal of said trigger circuit.

14. The gate drive circuit of claim 12 wherein said second circuit means further includes a steady-state protection circuit having a current limiting resistor and a diode, said current limiting resistor being electrically connected to the first common terminal of the latching switch and coupled to and through said diode to an end of the secondary winding of the first coupling transformer, said diode having a cathode electrode coupled to said end of the secondary winding of the first coupling transformer and an anode connected to said current limiting resistor of said steady-state protection circuit, said steady-state protection circuit thereby causing a continuous periodic retriggering pulse signal to be applied to the first common terminal of the latching switch circuit at a periodic rate equal to the frequency of the bias power signal whenever the bias power signal is induced across the secondary winding of the first coupling transformer, said retriggering pulse signal thereby causing the latching switch to continually reset, at a periodic rate equal to the frequency of the bias power signal, to the condition wherein the reverse-bias signal is impressed across the gate-emitter junction of the power transistor, thereby continually resetting the power transistor to the OFF state.

15. The gate drive circuit of claim 12 wherein said second circuit means further includes a steady-state protection circuit having a current limiting resistor and first and second diodes, said current limiting resistor being electrically connected to the first common terminal of the latching switch and coupled to and through said first and second diodes to a first end and a second end, respectively, of the secondary winding of the first coupling transformer, said first and second ends of said secondary winding of the first coupling transformer being at opposite electrical ends of said secondary winding, said first diode having a cathode electrode coupled to the first end of the secondary winding of the first coupling transformer and an anode connected to said current limiting resistor of said steady-state protection circuit, said second diode having a cathode electrode coupled to the second end of the secondary winding of the first coupling transformer and an anode connected to said current limiting resistor of said steady-state protection circuit, said steady-state protection circuit thereby causing a continuous periodic retriggering pulse signal to be applied to the first common terminal of the latching switch circuit at a periodic rate equal to twice the frequency of the bias power signal whenever the bias power signal is induced across the secondary winding of the first coupling transformer, said retriggering pulse signal thereby causing the latching switch to continually reset, at a periodic rate equal to twice the frequency of the bias power signal, to the condition wherein the reverse-bias signal is impressed across the gate-emitter junction of the power transistor, thereby continually resetting the power transistor to the OFF state.

16. The gate drive circuit of claim 10 wherein said transient protection circuit includes:

a first diode having an anode electrode connected to the gate connection terminal of the latching switch circuit and a cathode electrode coupled to the gate electrode of the power transistor, a second diode arranged in an anti-parallel circuit arrangement with respect to said first diode of said transient protection circuit, said second diode having a cathode electrode connected to the gate connection of the latching switch circuit, and an anode electrode coupled to the gate electrode of the power transistor, and a current limiting resistor connected between the gate electrode of the power transistor and the negative bus of the second circuit means.

* * * * *